United States Patent
Imasu et al.

(10) Patent No.: US 6,461,896 B1
(45) Date of Patent: Oct. 8, 2002

(54) PROCESS FOR MOUNTING ELECTRONIC DEVICE AND SEMICONDUCTOR DEVICE

(75) Inventors: Satoshi Imasu, Ohme (JP); Ikuo Yoshida, Musashimurayama (JP); Tetsuya Hayashida, Hinode-machi (JP); Akira Yamagiwa, Ooiso-machi (JP); Shinobu Takeura, Yamato (JP)

(73) Assignees: Hitachi, Ltd., Tokyo (JP); Hitachi Hokkai Semiconductor, Ltd., Hokkaido (JP)

( * ) Notice: Subject to any disclaimer, the term of this patent is extended or adjusted under 35 U.S.C. 154(b) by 0 days.

(21) Appl. No.: 09/565,070

(22) Filed: May 5, 2000

Related U.S. Application Data

(62) Division of application No. 09/048,054, filed on Mar. 26, 1998, now Pat. No. 6,208,525.

(30) Foreign Application Priority Data

Mar. 27, 1997 (JP) ............................................. 9-075970

(51) Int. Cl.[7] .......................... H01L 21/44; H01L 21/48; H01L 21/50
(52) U.S. Cl. ...................... 438/108; 438/106; 438/118; 438/119; 174/259; 174/263; 174/260; 361/765; 361/767; 361/768; 361/784; 361/792
(58) Field of Search ................................ 438/106, 108, 438/118, 119; 174/259, 260, 263; 361/765, 767, 768, 784, 792

(56) References Cited

U.S. PATENT DOCUMENTS

| | | |
|---|---|---|
| 4,929,999 A | 5/1990 | Hoeberechts et al. |
| 5,714,252 A | 2/1998 | Hogerton et al. |
| 5,874,780 A | 2/1999 | Murakami |

FOREIGN PATENT DOCUMENTS

| | | |
|---|---|---|
| EP | 0609918 | 8/1994 |
| JP | 4-345041 | 12/1992 |
| JP | 5-175280 | 7/1993 |
| JP | 9-33608 | 2/1997 |
| WO | 96/42106 | 12/1996 |

OTHER PUBLICATIONS

Denshi Zairyo, Apr. 1996, Kogyo Chosakia, pp. 14–19.

*Primary Examiner*—Kamand Cuneo
*Assistant Examiner*—David A. Zarneke
(74) *Attorney, Agent, or Firm*—Mattingly, Stanger & Malur, P.C.

(57) ABSTRACT

An electronic device comprising a semiconductor chip which is fixed to the mounting face of a wiring board through an adhesive and in which external terminals are electrically connected with electrode pads of the wiring board through bump electrodes. Recesses are formed in the electrode pads, and in the recesses the electrode pads and the bump electrodes are connected. The electrode pads are formed over the surface of a soft layer, and the recesses are formed by elastic deformation of the electrode pads and the soft layer.

9 Claims, 16 Drawing Sheets

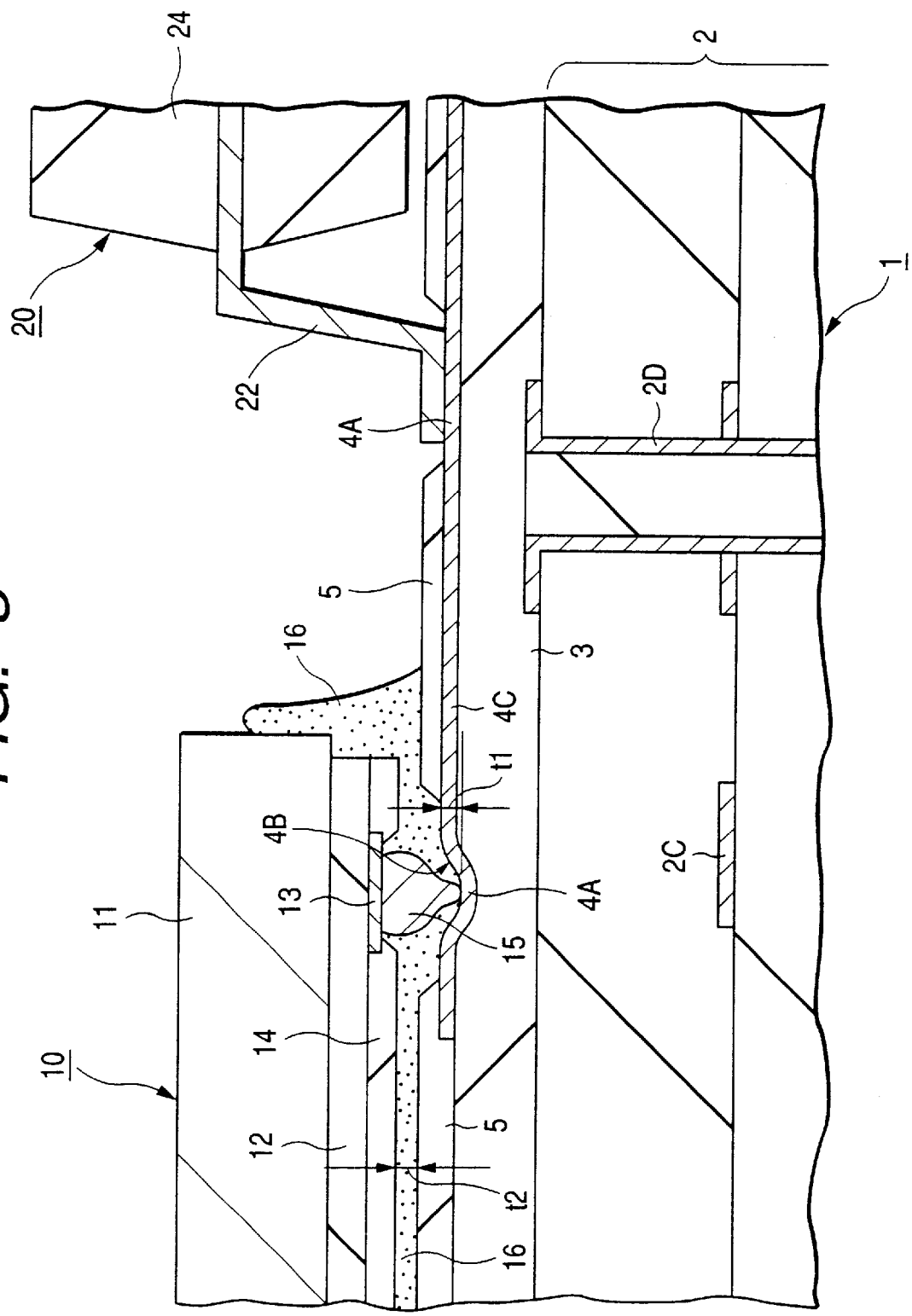

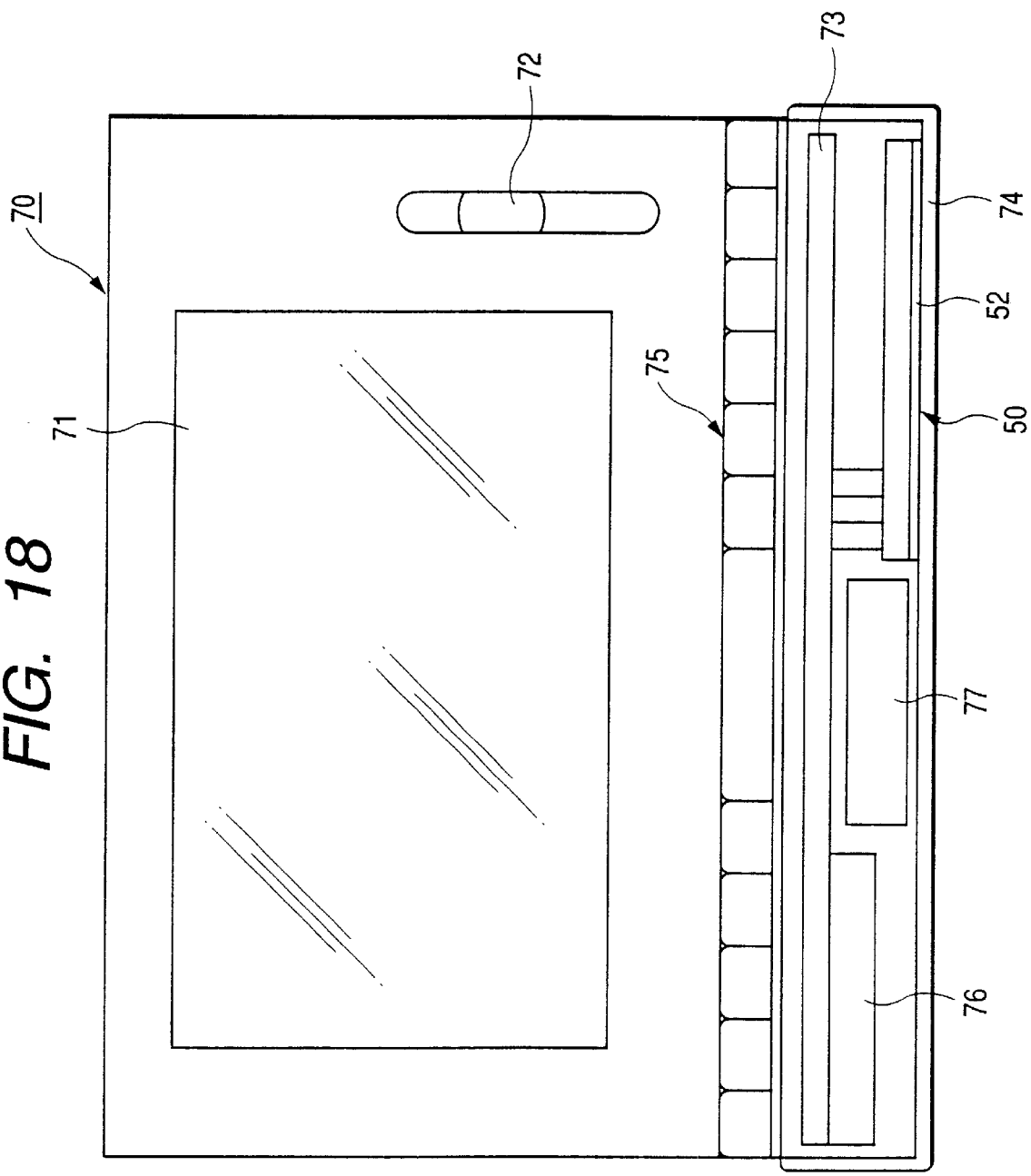

PROCESS FOR MOUNTING ELECTRONIC DEVICE AND SEMICONDUCTOR DEVICE

This is a divisional application of U.S. patent application Ser. No. 09/048,054, filed Mar. 26, 1998 now U.S. Pat. No. 6,208,525.

BACKGROUND OF THE INVENTION

The present invention relates to a technique effective when applied to an electronic device and a semiconductor device comprising a semiconductor chip which is fixed to the mounting face of a wiring board through an adhesive and in which external terminals are electrically connected with electrode pads of the wiring board through bump electrodes.

As a mounting method of mounting a semiconductor chip on the mounting face of a wiring board, there is the flip chip method which is effected by interposing bump electrodes between the electrode pads of the wiring board and external terminals of the semiconductor chip. This flip chip method is classified into the CCB (Controlled Collapse Bonding) method and the FCA (Flip Chip Attach) method.

By the CCB method, the electrode pads of the wiring board and the external terminals of the semiconductor chip are fixed by the bump electrodes, and that they are electrically and mechanically connected. Specifically, first, the bump electrodes having a ball shape and made of a metallic material having a composition of lead (Pb)—tin (Sn) are formed on the external terminals of the semiconductor chip. Next, the semiconductor chip is disposed on the wiring board so that the bump electrodes are sandwiched between the electrode pads of the wiring board and the external terminals of the semiconductor chip. Next, heat treatment is executed to melt the bump electrodes thereby to fix the electrode pads of the wiring board and the external terminals of the semiconductor chip. By this CCB method, the electrode pads of the wiring board and the external terminals of the semiconductor chip are fixed by the bump electrodes. As a result, the thermal stress produced by the difference in the coefficient of thermal expansion between the wiring board and the semiconductor chip may concentrate on the bump electrodes, thereby breaking the bump electrodes. In the CCB method, therefore, attempts have been made to compensate the mechanical strength of the bump electrodes with that of a resin by fixing the electrode pads of the wiring board and the external of the semiconductor chip with the bump electrodes and then by filling the clearance between the wiring board and the semiconductor chip with the resin. This technique is called the "under-fill structure" and is utilized in the technique of packaging a semiconductor device. Such a semiconductor device of this under-fill structure is disclosed, for example, in Denshi Zairyo [on pp. 14 to 19, Apr. issue, 1996], issued by Kogyo Chosakai.

In the FCA method, the bump electrodes formed on the external terminals of the semiconductor chip are pressed to the electrode pads of the wiring board to connect them electrically and mechanically. Specifically, first, the bump electrodes having a stud bump structure made of gold (Au) are formed on the external terminals of the semiconductor chip. Next, the semiconductor chip is so disposed on the wiring board through a sheet-shaped adhesive made of a thermosetting resin that the bump electrodes are sandwiched between the electrode pads of the wiring board and the external terminals of the semiconductor chip. Next, the semiconductor chip is thermally bonded to set the adhesive, with the bump electrodes connected with the electrode pads of the wiring board. In the adhesive restoring the room temperature state, a compression force such as a thermal shrinkage force or a thermosetting shrinkage force is generated to press the bump electrodes to the electrode pads of the wiring board. By this FCA method different from the foregoing CCB method, the electrode pads of the wiring board and the external terminals of the semiconductor chip are not fixed by using the bump electrodes, so that the thermal stress caused by the difference in the coefficient of thermal expansion between the wiring board and the semiconductor chip does not concentrate on the bump electrodes. Simultaneously the step of connecting the bump electrodes with the electrode pads of the wiring board and the step of filling the clearance between the wiring board and the semiconductor chip with the resin are conducted. This FCA method is effective in manufacturing an electronic device such as a memory module or CPU (Central Processing Unit) module in which a plurality of semiconductor chips are mounted over a wiring board.

Here, the FCA method is disclosed in Japanese Patent Laid-Open Nos. 4-345041/1992 and 5-175280/1993, for example.

SUMMARY OF THE INVENTION

We have investigated the FCA method and have found out the following problems.

Since the adhesive filled in the clearance between the wiring board and the semiconductor chip is made of a resin having a higher coefficient of thermal expansion than that of the bump electrodes, the expansion of the adhesive in the thickness direction is larger than that of the bump electrodes in the height direction. During the temperature cycle test, therefore, clearances are established between the electrode pads of the wiring board and the bump electrodes, thereby causing defective connections between the electrode pads of the wiring board and the bump electrodes.

The bump electrodes are held in press contact with the electrode pads of the wiring board by the thermal shrinkage or thermosetting shrinkage force of the adhesive. Since the amount of change of expansion and shrinkage due to the heat change of the bump electrodes is larger than that of the adhesive, plastic deformation is caused at the ends (on the electrode pad side of the wiring board) of the bump electrodes as a result of the repeated expansion and shrinkage during the temperature cycle test, so that the height of the bump electrodes decreases. As a result, the clearance is established between the electrode pads of the wiring board and the bump electrodes, causing the defective connection between the electrode pads of the wiring board and the bump electrodes.

An object of the invention is to provide a technique capable of enhancing the reliability of the connection between the electrode pads of the wiring board and the bump electrodes.

The foregoing and other objects and novel features of the invention will become apparent from the following description to be made with reference to the accompanying drawings.

A representative aspect of the invention to be disclosed herein will be briefly described in the following.

There is provided an electronic device comprising a semiconductor chip which is fixed to the mounting face of a wiring board through an adhesive and in which external terminals are electrically connected with electrode pads of the wiring board through bump electrodes, wherein there are formed recesses in the electrode pads, and in the recesses the electrode pads are connected to the bump electrodes. The electrode pads are formed on the surface of a soft layer, and the recesses are formed by elastic deformation of the electrode pads and the soft layer.

By this means, the clearance between the wiring board and the semiconductor chip can be narrowed to an extent corresponding to the depth of the recesses, thereby reducing the thickness of the adhesive sandwiched between the wiring board and the semiconductor chip. As a result, the expansion of the adhesive in the thickness direction can be suppressed, thereby preventing defective connection between the electrode pads of the wiring board and the bump electrodes during the temperature cycle test, and enhancing the reliability of connection therebetween.

Since the amount of change of expansion and shrinkage of the adhesive due to heat change can be reduced, moreover, it is possible to suppress the plastic deformation, which might otherwise be caused by repeated expansion and shrinkage during the temperature cycle test, of the ends (on the electrode pad side of the wiring board) of the bump electrodes.

BRIEF DESCRIPTION OF THE DRAWINGS

FIG. 3 is an enlarged section showing an essential portion of FIG. 2;

FIG. 18 is a diagram showing a schematic construction of an information processor having the CPU module packaged therein.

DESCRIPTION OF THE PREFERRED EMBODIMENTS

Figure 1:
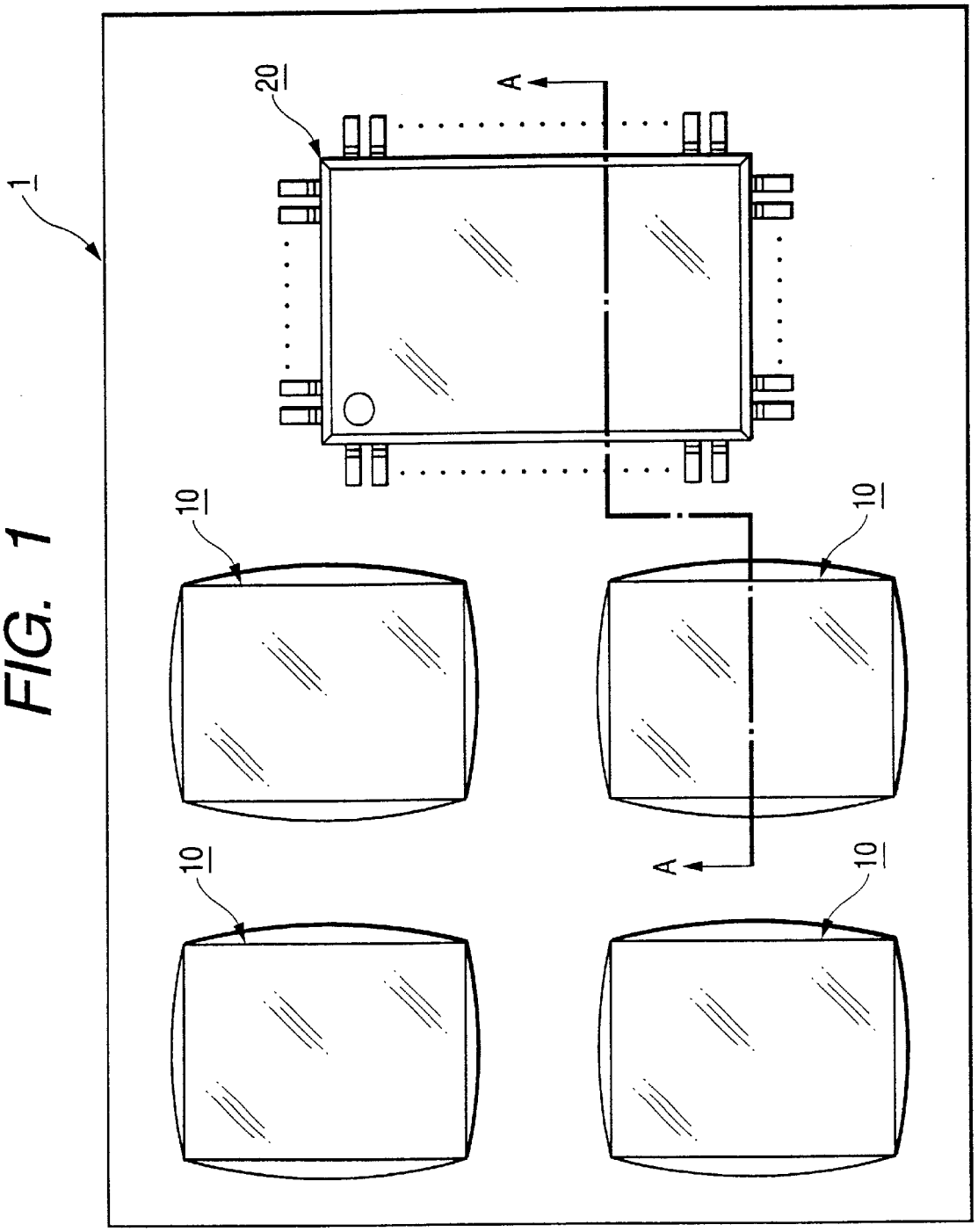
FIG. 1 is a top plan view showing a memory module (electronic device) of Embodiment 1 of the invention.

The invention will be described in detail as related to its embodiments with reference to the accompanying drawings.

Throughout all the drawings illustrating the embodiments of the invention, portions having identical functions are designated by identical reference numerals, and their repeated description will be omitted.

Embodiment 1

Figure 2:
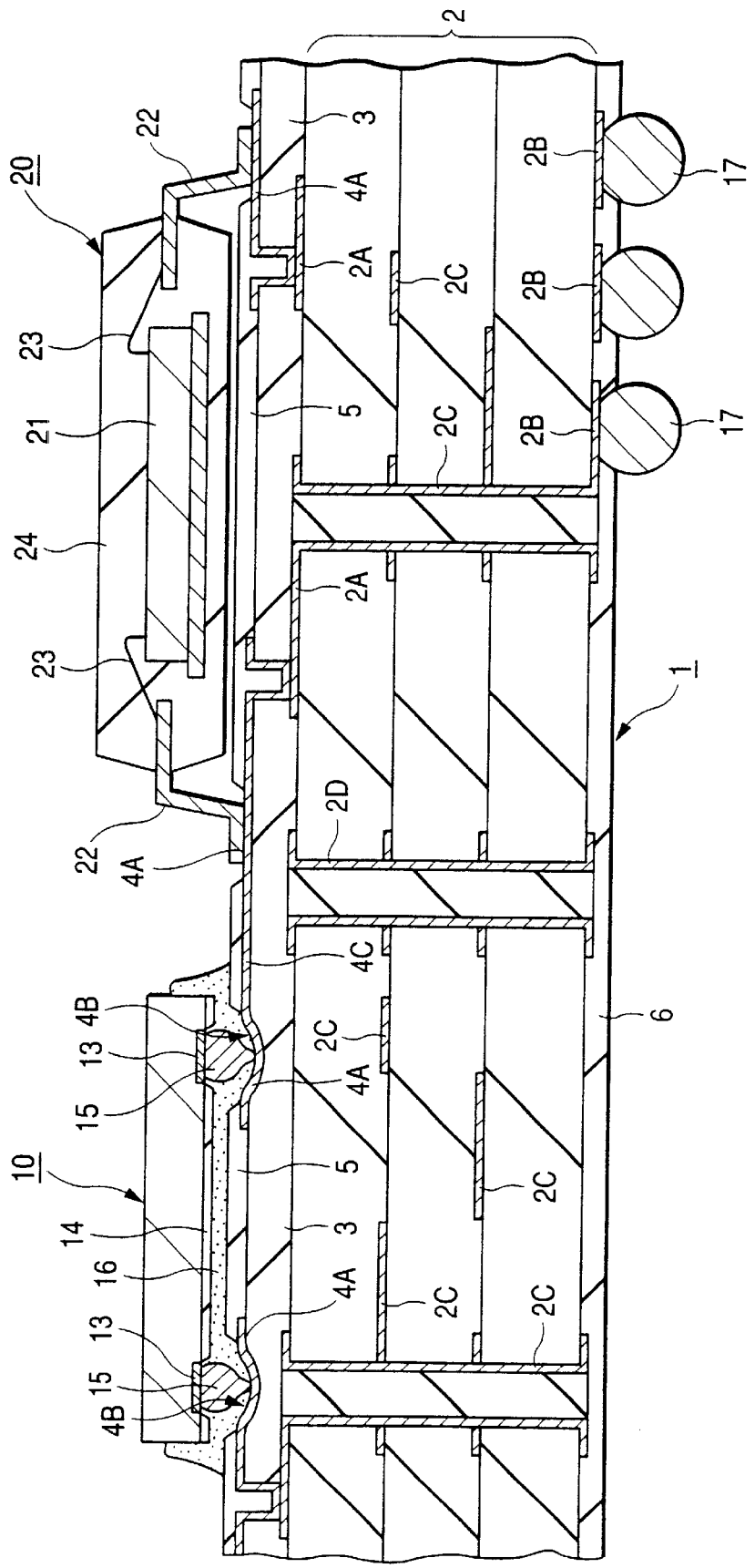
FIG. 2 is a section showing an essential portion of FIG. 1 and taken along line A—A of FIG. 1.

FIG. 1 is a top plan view showing a memory module (electronic device) of Embodiment 1 of the invention; FIG. 2 is a section showing an essential portion of FIG. 1 and taken along line A—A of FIG. 1; and FIG. 3 is an enlarged section showing an essential portion of FIG. 2.

A memory module (electronic device) of the present embodiment includes four semiconductor chips 10 and one semiconductor device 20 mounted as mount parts on the mounting face of a wiring board 1, as shown in FIG. 1, to construct one memory system. In each of the four semiconductor chips 10, there is provided as a memory circuit an SRAM (Static Random Access Memory), for example. In the single semiconductor device 20, there is provided a control circuit for controlling the memory circuit of each of the four semiconductor chips 10.

The wiring board 1 is so constructed, as shown in FIG. 2, as to have a structure in which a soft layer 3 is formed on one surface of a rigid board 2. This rigid board 2 is made of a resin, which is prepared by impregnating glass fibers with an epoxy resin or polyimide resin, for example. The rigid board 2 of the embodiment has a multi-layer wiring structure. The soft layer 3 is made of an epoxy resin having a low elasticity, e.g., a resin having a modulus of elasticity of about 2 GPa to 7 GPa at room temperature.

On the surface of the soft layer 3, there are arranged a plurality of electrode pads 4A, although not shown in detail. Each of these electrode pads 4A is electrically connected, through a wiring 4C extending on the soft layer 3, with a wiring 2A extending on one surface of the rigid board 2. The wiring line 2A is electrically connected through an internal wiring 2C of the rigid board 2 with each of a plurality of electrode pads 2B arranged on the back of the rigid board 2. With each of these electrode pads 2B, there is electrically and mechanically connected a ball-shaped bump electrode 17 which is made of a metallic material having a composition of Pb—Sn, for example. The electrode pad 4A, the wiring 4C, the wiring 2A, the electrode pad 2B and the internal wiring 2C are individually a copper (Cu) film, for example.

The surface of the soft layer 3 and the surface of the wiring 4C are covered with a passivation film 5, and the back of the rigid board 2 is covered with a passivation film 6. These passivation films 5 and 6 are made of a polyimide resin, for example.

The semiconductor device 20 is constructed so as to have a structure in which the external terminals of a semiconductor chip 21 and the inner portions of leads 22 are electrically connected through bonding wires 23 and the semiconductor chip 21, the inner portions of the leads 22 and the bonding wires 23 are encapsulated with a resin encapsulating material 24. The outer portions of the leads 22 of the semiconductor device 20 are electrically and mechanically connected with the electrode pads 4A of the wiring board 1 by soldering.

The semiconductor chips 10 are bonded and fixed to the mounting face of the wiring board 1 through an adhesive 16. This adhesive 16 is made of a thermosetting resin such as an epoxy resin.

The semiconductor chip 10 includes, as shown in FIG. 3, mainly a semiconductor substrate 11 made of single crystalline silicon, for example. On the element forming face (on the lower face of FIG. 3) of the semiconductor substrate 11, there are formed elements constituting an SRAM, and there are arranged a plurality of external terminals 13. Each of these external terminals 13 is formed on the uppermost layer out of the wiring layers which are formed on the element forming face of the semiconductor substrate 11 through an insulating layer 12, and comprises an aluminum (Al) film or an aluminum alloy film, for example. Each external terminal 13 is electrically connected, through a wiring formed in the wiring layer, with the elements constituting the SRAM. On the uppermost wiring layer, there is formed a final passivation film 14. This final passivation film 14 is made of a polyimide isoindole quinazolinedion (PIQ) resin.

Between the external terminals 13 of the semiconductor chip 10 and the electrode pads 4A of the wiring board 1, as shown in FIGS. 2 and 3, there are interposed bump electrodes 15. These bump electrodes 15 are fixed to and electrically and mechanically connected with the external terminals 13 of the semiconductor chip 10 through the openings formed in the final passivation film 14 of the semiconductor chip 10. Moreover, the bump electrodes 15 are pressed to and electrically and mechanically connected with the electrode pads 4A of the wiring board 1 through the openings formed in the passivation film 5 of the wiring board 1. The connection of the bump electrodes 15 by the press is effected by the compressive force which are produced in the adhesive 16 by thermal shrinkage and thermosetting shrinkage. In short, the semiconductor chip 10 is mounted over the mounting face of the wiring board 1 by the FCA method.

The bump electrodes 15 has a stud bump structure, although not limited thereto. This stud bump structure is made by the ball bonding method. In this ball bonding method, the balls formed at the leading end portions of Au wires are connected to the external terminals of the semiconductor chip by thermocompression bonding, and the Au wires are cut from the portions of the balls to form the bump electrodes.

In the electrode pad 4A against which the bump electrode 15 is pressed, there is formed a recess 4B, in which the bump electrode 15 and the electrode pad 4A are Connected. This connection between the bump electrode 15 and the electrode pad 4A is effected in a deeper position, in the depthwise direction from the mounting face of the wiring board 1, than the connection between the lead 22 of the semiconductor device 20 and the electrode pad 4A.

The thickness of the adhesive 16, interposed between the wiring board 1 and the semiconductor chip 10, is defined by the clearance t2 between the wiring board 1 and the semiconductor chip 10. This clearance t2 is defined by the height of the bump electrode 15 but is reduced by the depth t1 of the recess 4B because the connection between the bump electrode 15 and the bump electrode 4A is effected in the recess 4B formed in the electrode pad 4A. In the electrode pad 4A of the wiring board 1, more specifically, there is formed the recess 4B in which the bump electrode 15 and the electrode pad 4A are connected, so that the clearance t2 between the wiring board 1 and the semiconductor chip 10 is narrowed to an extent corresponding to the depth t1 of the recess 4B. This makes it possible to reduce the thickness of the adhesive 16 interposed between the wiring board 1 and the semiconductor chip 10. As a result, the expansion of the adhesive 16, in the thickness direction, between the wiring board 1 and the semiconductor chip 10 can be reduced without reducing the height of the bump electrode 15.

The recess 4B in the electrode pad 4A is formed by elastic deformation of the electrode pad 4A and the soft layer 3. The elastic deformation of the electrode pad 4A and the soft layer 3 occurs as a result that the bump electrode 15 is pressed to the electrode pad 4A by the pressure of the semiconductor chip 10 when this semiconductor chip 10 is mounted on the mounting face of the wiring board 1. As a result, the elastic forces of the electrode pad 4A and the soft layer 3 act upon the bump electrode 15.

A process for manufacturing the memory module and a process for mounting the semiconductor chip 10 will be described with reference to FIGS. 4 to 7 (sections illustrating the manufacture processes).

Figure 4A:
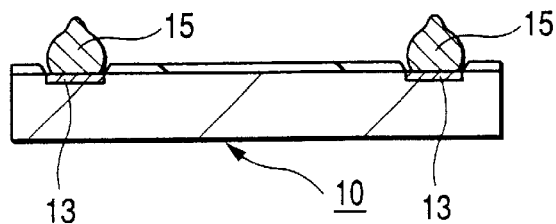
FIG. 4A, 4B and 4C are sectional views illustrating a process for manufacturing the electronic device.

First, a semiconductor chip 10 is prepared, and bump electrodes 15 of the stud bump structure are formed on the external terminals 13 of the semiconductor chip 10 by the ball bonding method, as shown in FIG. 4(A). This ball bonding method is a method for forming bump electrodes by bonding the balls formed at the end portions of the Au wires to the external terminals of the semiconductor chip by thermocompression bonding and subsequently by cutting the Au wires at the portions of the balls. As a result, the bump electrodes 15 of the stud bump structure take a larger height than that of the bump electrodes which are formed by the lift-off method and the ball supply method.

Figure 4B:
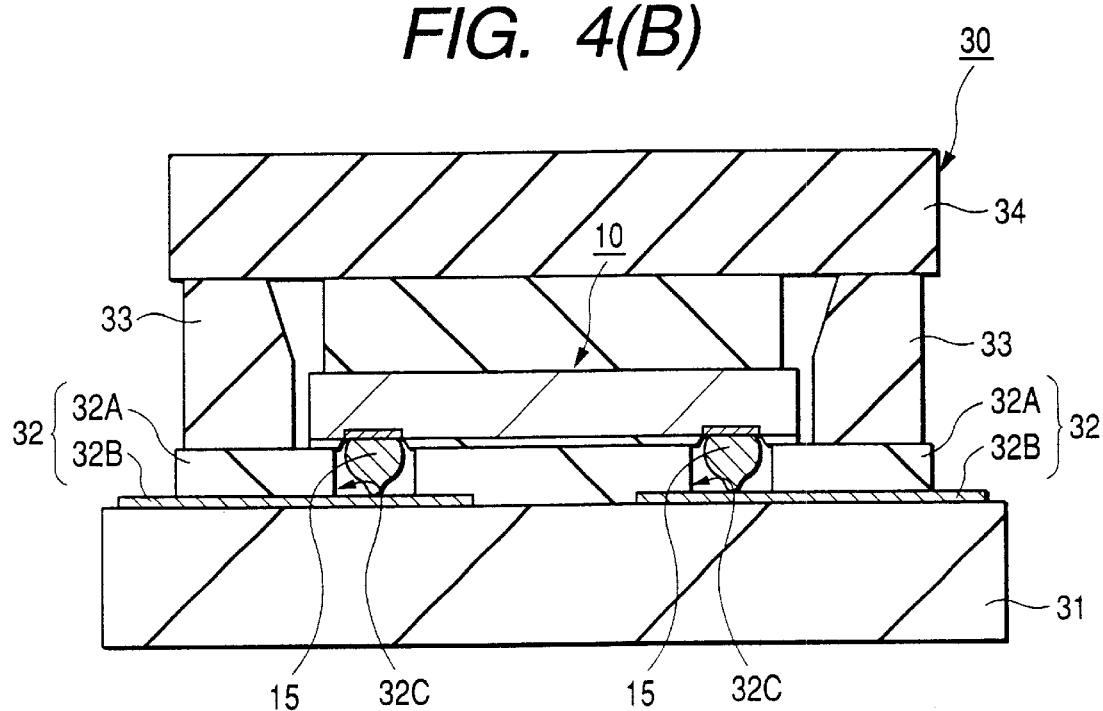

Next, as shown in FIG. 4(B) the semiconductor chip 10 is mounted on a bare chip carrier jig 30 and is subjected to a burn-in test. This burn-in test is conducted with a view to eliminating defective products at the initial stage before they are shipped to the customer, by operating the circuit of the semiconductor chip 10 under more severe use conditions (under a load) than the use conditions under which the customer uses the products so as to accerelate, in a sence, the occurrence of defects, which might occur during the use by the customer. The bare chip carrier jig 30 includes: a base member for mounting the semiconductor chip 10; a film member 32 having a wiring 32B formed on one surface of an insulating film 32A; a guide member 33 for positioning the semiconductor chip 10; and a cover member 34 for pressing and fixing the semiconductor chip 10. The bare chip carrier jig 30 is constructed so as to connect the wiring 32B and the bump electrodes 15 through contact holes 32C formed in the insulating film 32A. This makes it necessary to make the bump electrodes 15 higher than the thickness of the insulating film 32A.

Figure 4C:
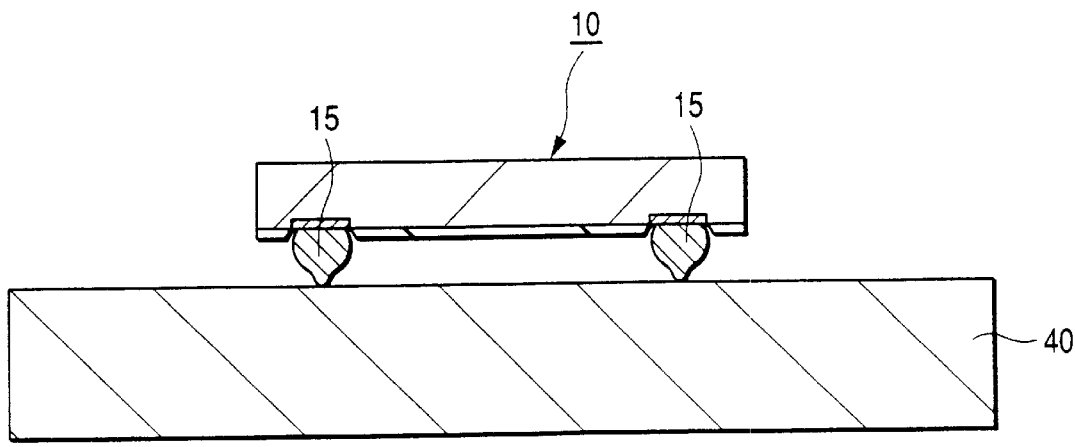

Next, as shown in FIG. 4(C), the semiconductor chip 10 is disposed on a glass substrate 40 and is pressed to equalize the heights of the bump electrodes 15.

Figure 5:
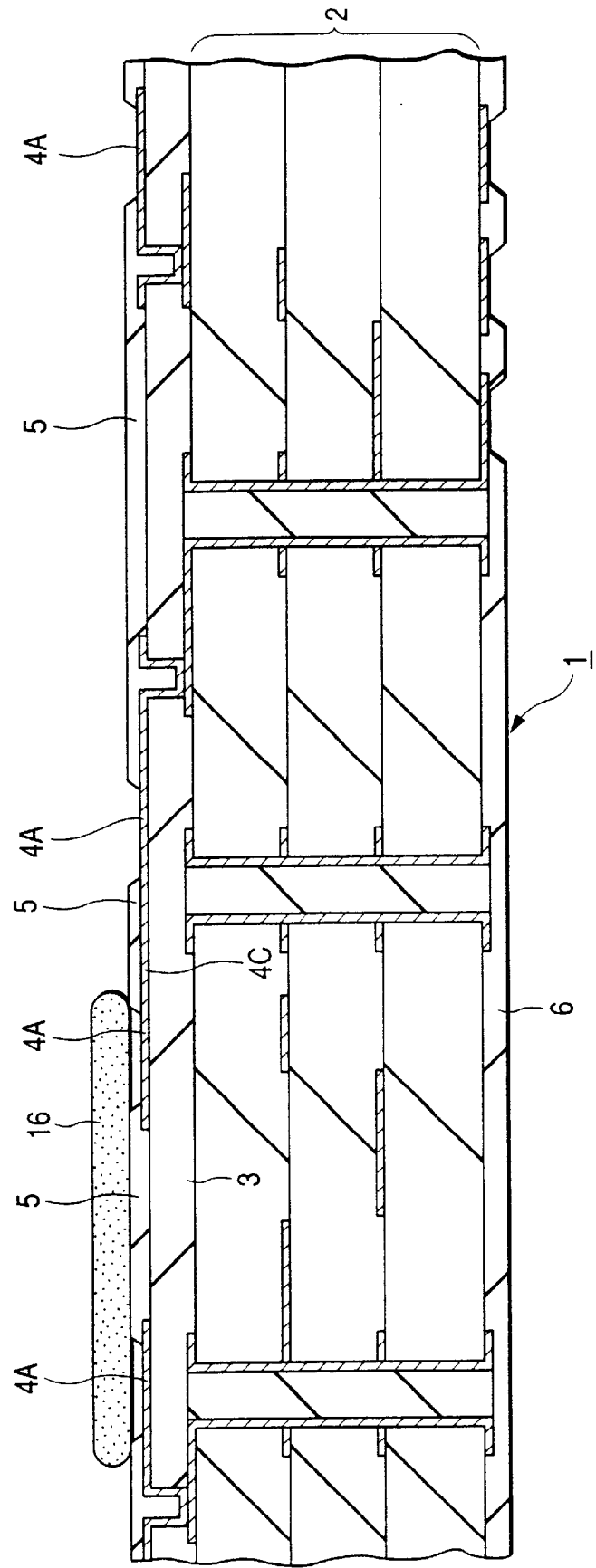
FIG. 5 is a section illustrating the process for manufacturing the electronic device.

Next, as shown in FIG. 5, the adhesive 16 in the form of a sheet (film), is applied to the chip mounting region of the mounting face of the wiring board 1. The adhesive 16 is made of a thermosetting resin such as epoxy. The wiring board 1 is constructed so as to have a structure in which the soft layer 3 is formed on one surface of the rigid board 2. The electrode pads 4A and the wiring 4C are arranged on the surface of the soft layer 3. The surface of the soft layer 3 and the surface of the wiring 4C are covered with the passivation film 5. The back of the rigid board 2 is covered with the passivation film 6.

Figure 6:
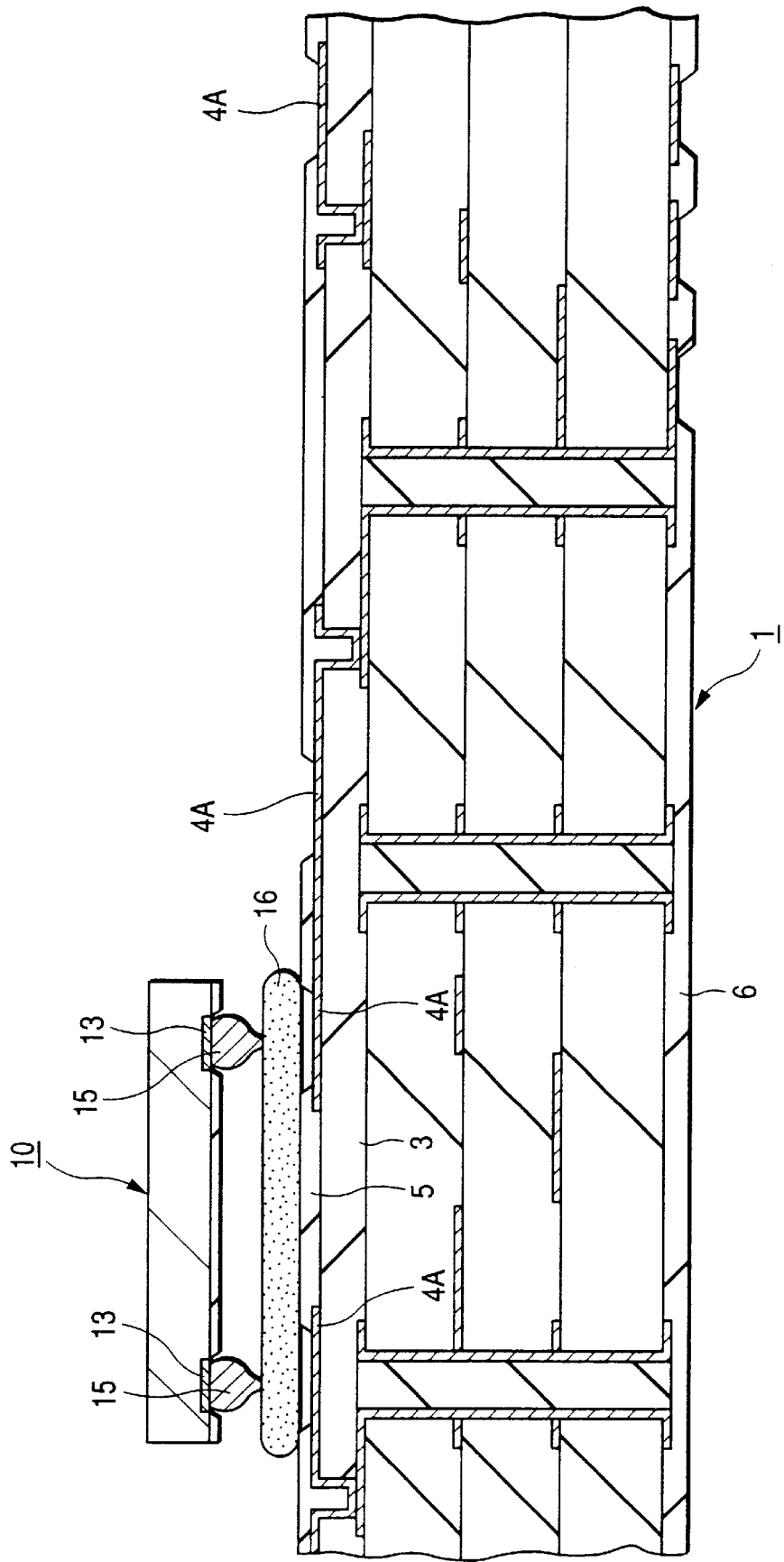
FIG. 6 is a section illustrating the process for manufacturing the electronic device.

Next, as shown in FIG. 6, the semiconductor chip 10 is disposed on the chip mounting region of the mounting face of the wiring board 1 through the adhesive 16, and the bump electrodes 15 are arranged between the electrode pads 4A of the wiring board 1 and the external terminals 13 of the semiconductor chip 10.

Figure 7:
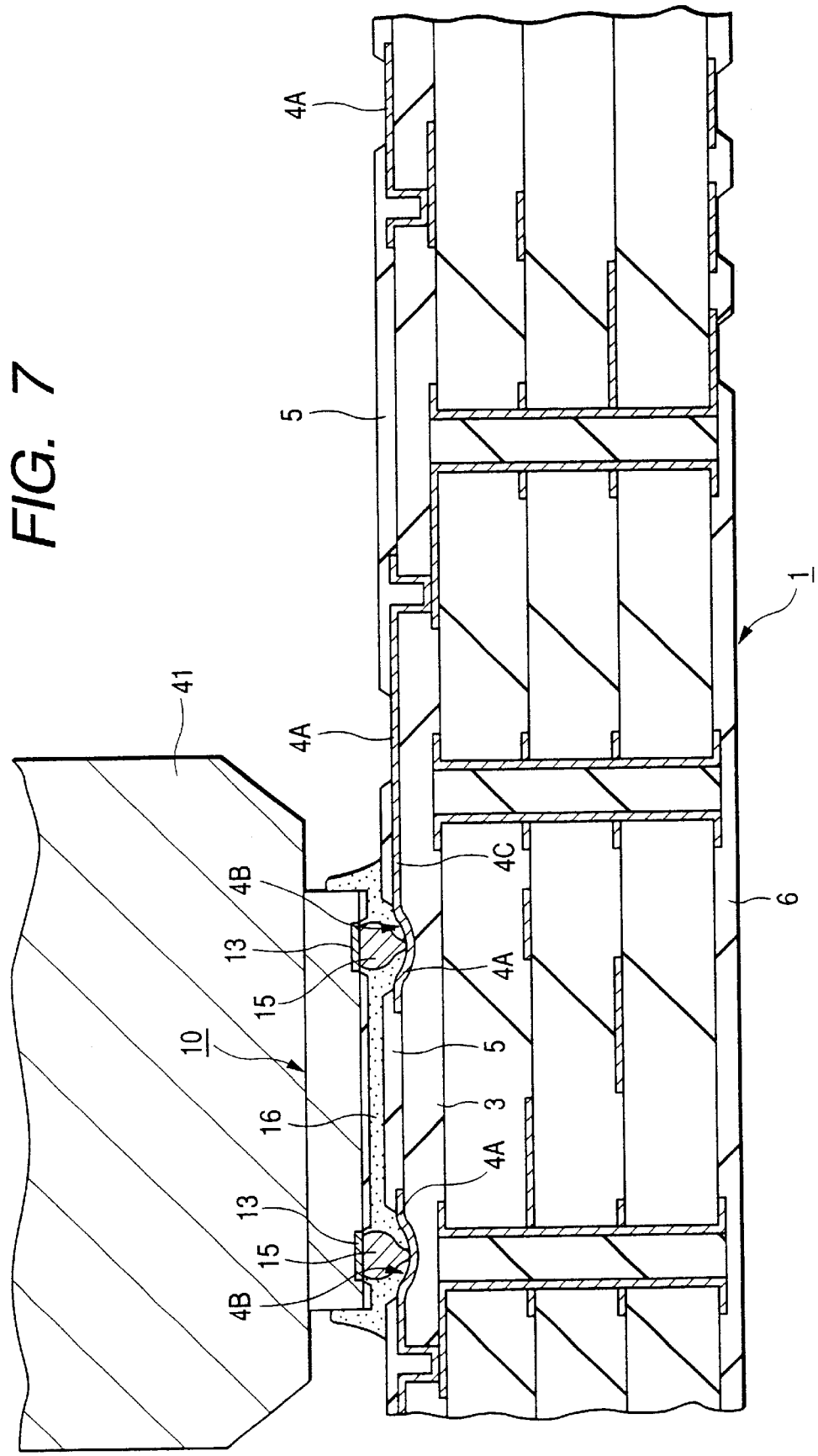
FIG. 7 is a section illustrating the process for manufacturing the electronic device.
Figure 8:
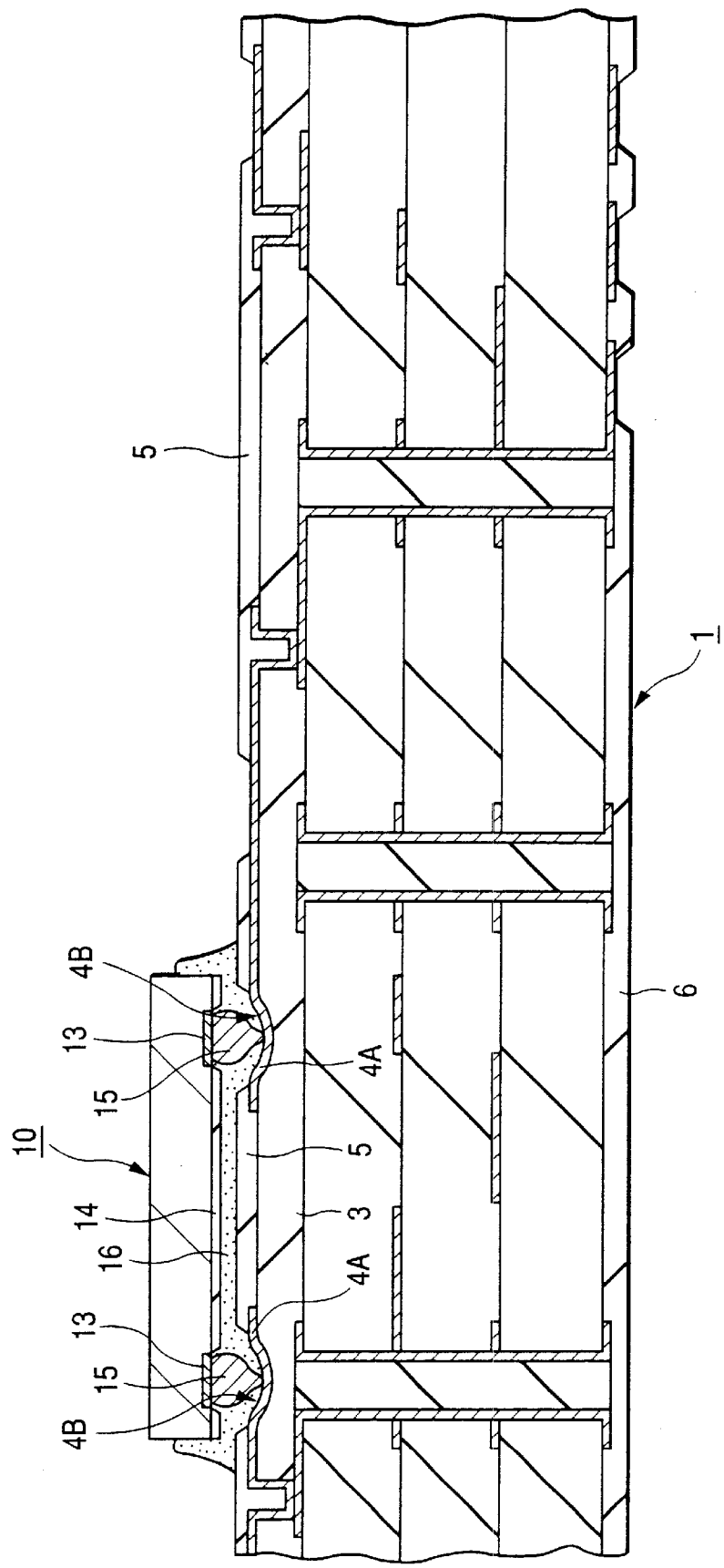
FIG. 8 is a section illustrating the process for manufacturing the electronic device.

Next, as shown in FIG. 7, the semiconductor chip 10 is bonded by thermocompression bonding using a heater 41 to press the electrode pads 4A by means of the bump electrodes 15, thereby forming the recesses 4B in the electrode pads 4A. Then the adhesive 16 is cured in this state. At this step, the clearance between the wiring board 1 and the semiconductor chip 10 is narrowed to an extent corresponding to the depth of the recesses 4B so that the thickness of the adhesive 16 sandwiched between the wiring board 1 and the semiconductor chip 10 is reduced. Since the recesses 4B are formed by the elastic deformation of the electrode pads 4A and the soft layer 3, moreover, the elastic forces of the electrode pads 4A and the soft layer 3 act upon the bump electrodes 15. By this step, the semiconductor chip 10 is mounted on the wiring board 1, as shown in FIG. 8.

Next, the semiconductor device 20 is disposed on another region of the mounting face of the wiring board 1, and the leads 22 are arranged over the electrode pads 4A through a pasty solder.

Next, a heat treatment is conducted to melt the pasty solder to fix the electrode pads 4A of the wiring board 1 to the leads 22 of the semiconductor device 20. As a result, the semiconductor device 20 is mounted on the wiring board 1.

Next, the ball-shaped bump electrodes 17 are individually fixed to the electrode pads 2B arranged on the back of the wiring board 1 and then subjected to a cleaning treatment and a baking treatment, completing a memory module (electronic device), as shown in FIGS. 1 and 2.

Here, the soft layer 3 is made of a material having a smaller coefficient of thermal expansion than that of the material of the adhesive 16.

Thus, the following effects can be achieved from the present embodiment.

There is provided an electronic device comprising a semiconductor chip 10 which is fixed to the mounting face of a wiring board 1 through adhesive 16 and in which external terminals 13 are electrically connected with electrode pads 4A of the wiring board 1 through bump electrodes 15, wherein there are formed in the electrode pads 4A recesses 4B in which the electrode pads 4A and the bump electrodes 15 are connected. By this construction, the clearance t2 between the wiring board 1 and the semiconductor chip can be narrowed to an extent corresponding to the depth t1 of the recesses 4B, thereby reducing the thickness of the adhesive 16 sandwiched between the wiring board 1 and the semiconductor chip 10. As a result, the expansion of the adhesive 16 in the thickness direction can be reduced to prevent defective connection between the electrode pads 4A of the wiring board 1 and the bump electrodes 15 occurring during the temperature cycle test, enhancing the reliability of their connection.

Moreover, the amount of change of expansion and shrinkage of the adhesive 16 due to the heat change can be reduced to suppress the plastic deformation, which may be caused by the repeated expansion and shrinkage during the temperature cycle test, of the ends (on the electrode pad side of the wiring board) of the bump electrodes 15. As a result, defective connection between the electrode pads 4A of the wiring board 1 and the bump electrodes 15 can be prevented, enhancing the reliability of their connection.

The electrode pads 4A are formed on the surface of a soft layer 3, and the recesses 4B are formed by elastic deformation of the electrode pads 4A and the soft layer 3. By this construction, the elastic forces of the electrode pads 4A and the soft layer 3 act upon the electrode pads 15, so that the pressing forces between the electrode pads 4A of the wiring board 1 and the bump electrodes 15 increase.

Even if the bump electrodes 15 are moved upward by the expansion of the adhesive 16 in the thickness direction, moreover, the depth of the recesses 4B changes following up the movement of the bump electrodes 15, so that the connection between the electrode pads 4A and the bump electrodes 15 can be retained.

Here, the embodiment described is an example in which the adhesive 16 used is a sheet made of a thermosetting resin of epoxy. However, an anisotropic conductive film or a thermoplastic resin film may be used.

Figure 9:
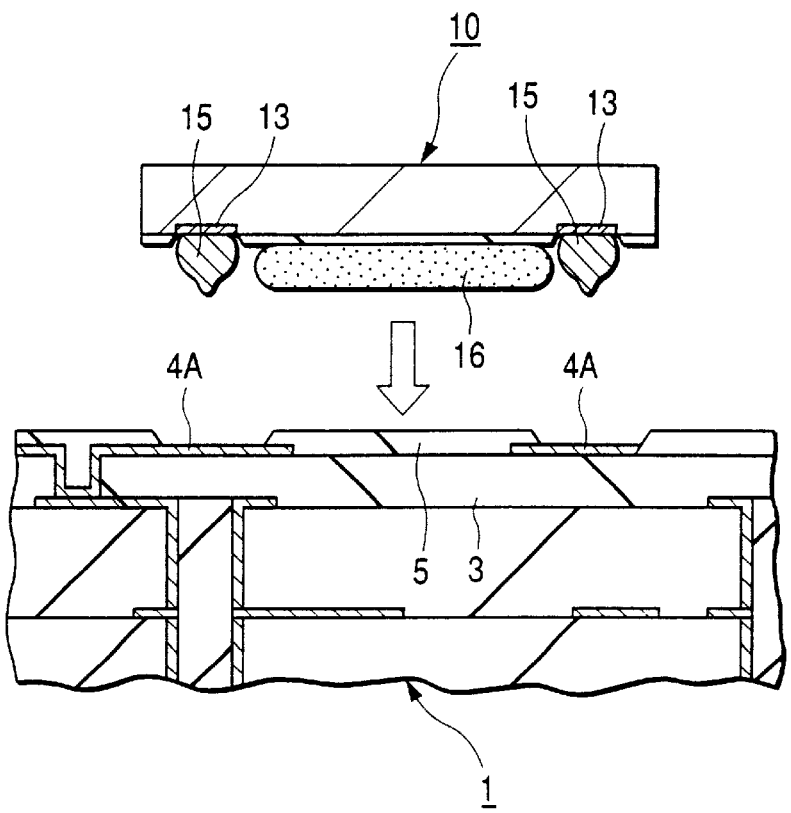
FIG. 9 is a section showing a modification of Embodiment 1 of the invention.

The embodiment which has been described is an example in which the sheet-shaped adhesive 16 is joined to the wiring board 1. As shown in FIG. 9 (a section), however, the sheet-shaped adhesive 16 may be applied to the semiconductor chip 10.

Figure 10:
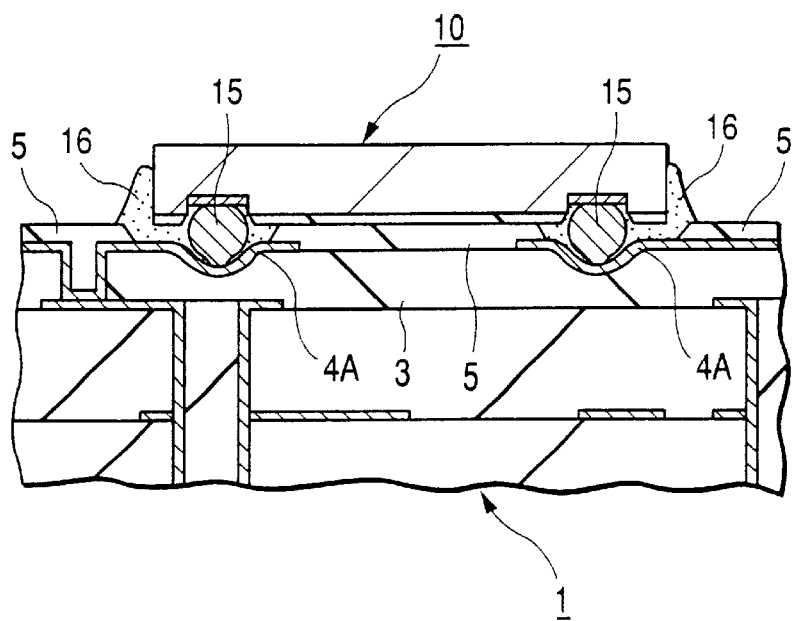
FIG. 10 is a section showing a modification of Embodiment 1 of the invention.

The present embodiment has been described taking the case in which a clearance is provided between the wiring board 1 and the semiconductor chip 10. As shown in FIG. 10 (a section), however, the semiconductor chip 10 may be in contact with the wiring board 1. In this case, the adhesive 16 exists only on the regions of the electrode pads 4A, so that the reliability of connection between the electrode pads 4A of the wiring board 1 and the bump electrodes 15 can be further enhanced.

Figure 11:
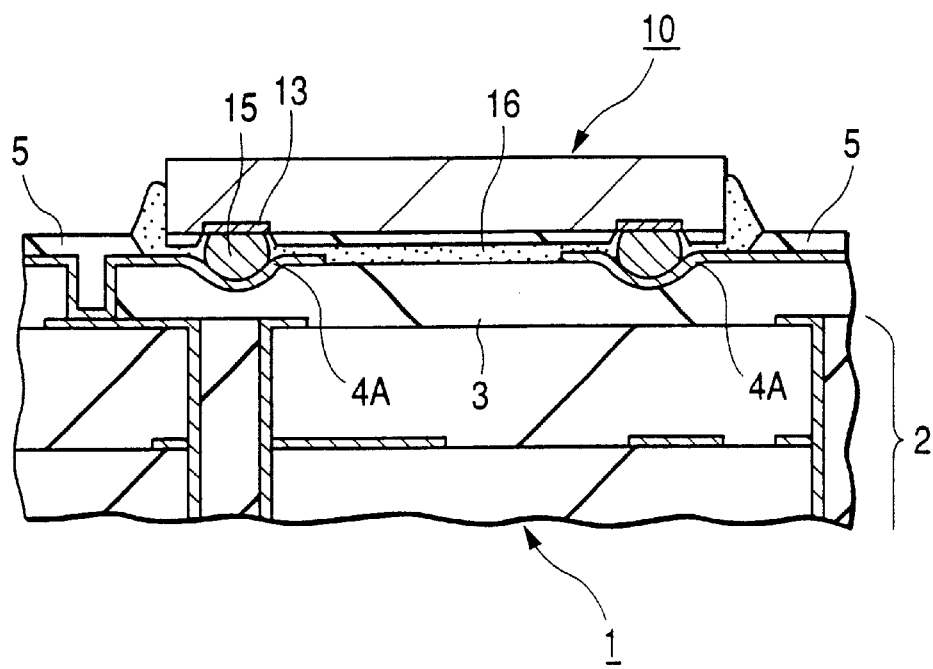
FIG. 11 is a section showing a modification of Embodiment 1 of the invention.

The embodiment described is an example in which the bump electrodes 15 are made of gold, but the bump electrodes 15 may be made of an alloy material having a composition of Pb—Sn or Sn—Ag, for example. In this case, the bump electrodes 15 are formed by the lift-off method or the ball supply method, so that they are shaped into balls, as shown in FIG. 11 (a section).

Figure 12:
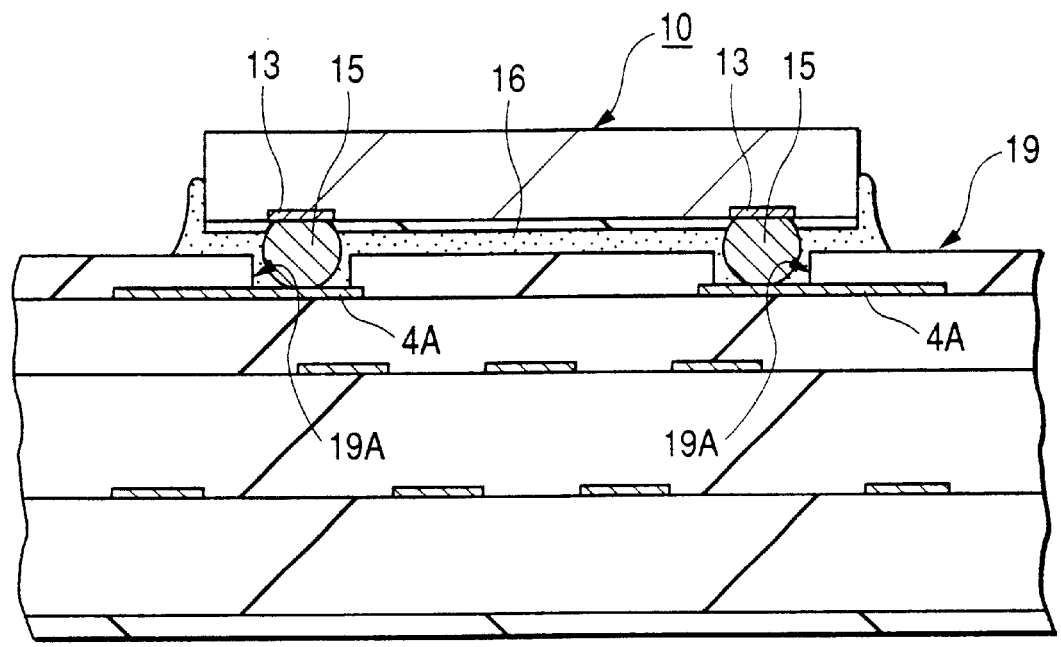
FIG. 12 is a section showing a modification of Embodiment 1 of the invention.

The present embodiment described is an example in which the wiring board 1 having the electrode pads 4A through the soft layer 3 is formed on the rigid board 2 and the recesses 4B are formed in the electrode pads 4A. As shown in FIG. 12 (a section), however, the construction may be the one that in a wiring board 19 having a rigid board, grooves 19A are formed in which the electrode pads 4A are formed and connected with the bump electrodes 15. In this modification, the clearance between the wiring board 19 and the semiconductor chip 10 can be narrowed to an extent corresponding to the depth of the grooves 19, thereby reducing the thickness of the adhesive 16 sandwiched between the wiring board 19 and the semiconductor chip 10.

Embodiment 2

Figure 13:
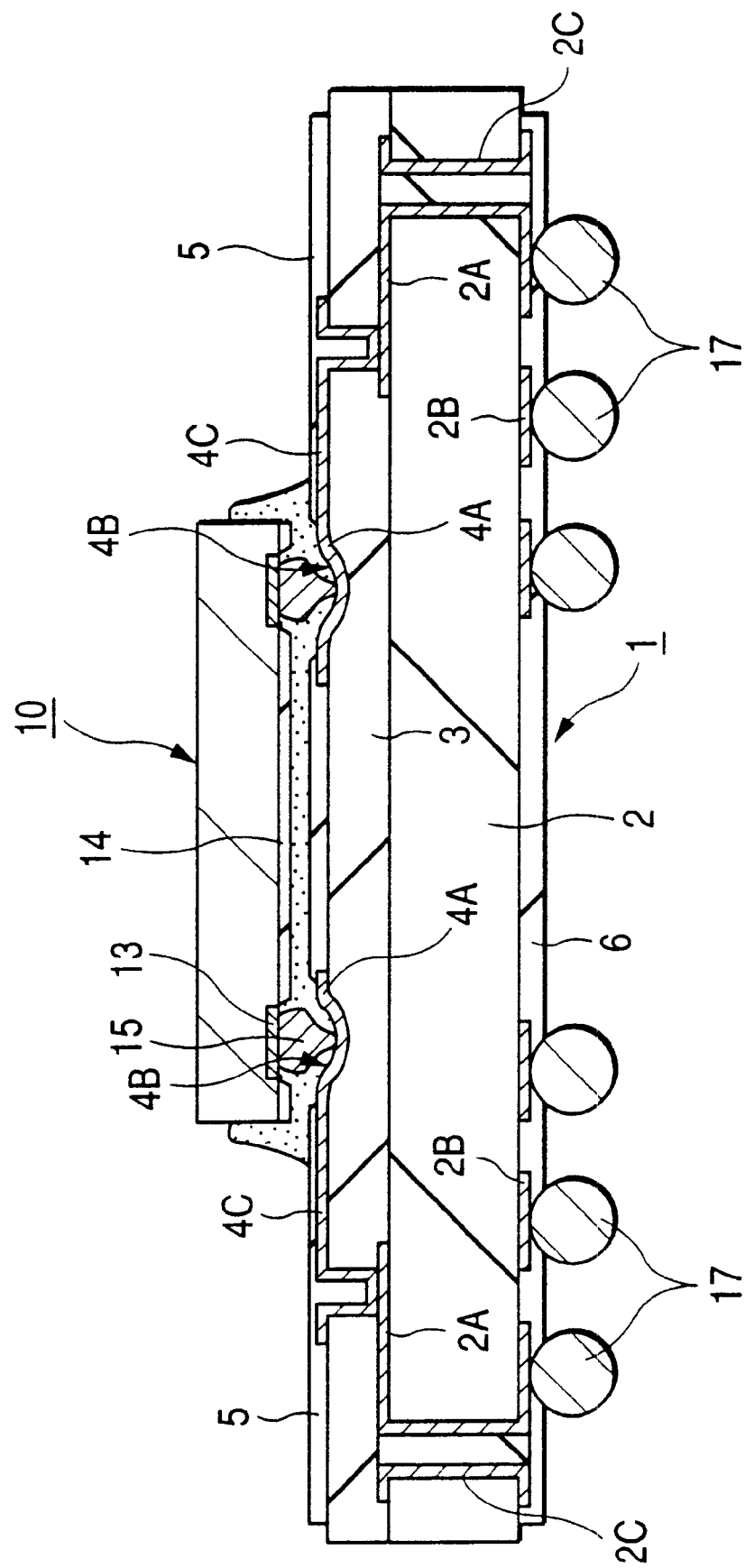
FIG. 13 is a section showing of a semiconductor device of Embodiment 2 of the invention.

FIG. 13 is a section showing a semiconductor device of Embodiment 2 of the invention.

In the semiconductor device of the embodiment, as shown in FIG. 13, a semiconductor chip 10 is mounted on a mounting face of a wiring board 1. This wiring board 1 is constructed so as to have a structure in which a soft layer 3 is formed on the surface of a rigid board 2 as in the foregoing Embodiment 1.

On the surface of the soft layer 3, there are arranged a plurality of electrode pads 4A, although not shown in detail. Each of these electrode pads 4A is electrically connected, through a wiring 4C extending on the soft layer 3, with a wiring 2A extending on one surface of the rigid board 2. The wiring 2A is electrically connected through an internal wiring 2C of the rigid board 2 with each of a plurality of electrode pads 2B arranged on the back of the rigid board 2. With each of these electrode pads 2B, there is electrically and mechanically connected a ball-shaped bump electrode 17 which is made of a metallic material having a composition of Pb-Sn, for example.

The surface of the soft layer 3 and the surface of the wiring 4C are covered with a passivation film 5, and the back of the rigid board 2 is covered with a passivation film 6. These passivation films 5 and 6 are made of a polyimide resin, for example.

The semiconductor chip 10 is bonded and fixed to the mounting face of the wiring board 1 through an adhesive 16. This adhesive 16 is made of a thermosetting resin such as an epoxy resin.

The semiconductor chip 10 includes a semiconductor substrate made of single crystalline silicon, for example. On the element forming face of the semiconductor substrate, there are arranged a plurality of external terminals 13. Each of these external terminals 13 is formed on the uppermost layer out of wiring layers which are formed on the element forming face of the semiconductor substrate 11. On the uppermost wiring layer, there is formed a final passivation film 14.

Between the external terminals 13 of the semiconductor chip 10 and the electrode pads 4A of the wiring board 1, there are sandwiched bump electrodes 15. These bump electrodes 15 are fixed to and electrically and mechanically connected with the external terminals 13 of the semiconductor chip 10 through the openings formed in the final passivation film 14 of the semiconductor chip 10. Moreover, the bump electrodes 15 are pressed against and electrically and mechanically connected with the electrode pads 4A of the wiring board 1 through the openings formed in the passivation film 5 of the wiring board 1. The connection of the bump electrodes 15 by the press contact is effected by the compression force which is produced in the adhesive 16 by thermal shrinkage and thermosetting shrinkage. In short, the semiconductor chip 10 is mounted over the mounting face of the wiring board 1 by the FCA method.

In the electrode pad 4A against which the bump electrode 15 is pressed, there is formed a recess 4B, in which the bump electrode 15 and the electrode pad 4A are connected.

The thickness of the adhesive 16 sandwiched between the wiring board 1 and the semiconductor chip 10 is defined by the clearance between the wiring board 1 and the semiconductor chip 10. This clearance is defined by the height of the bump electrodes 15 but is reduced by the depth of the recesses 4B because the connection between the bump electrodes 15 and the bump electrodes 4A is effected in the recesses 4B formed in the electrode pads 4A. In the electrode pads 4A of the wiring board 1, more specifically, there is formed the recesses 4B in which the bump electrodes 15 and the electrode pads 4A are connected, so that the clearance between the wiring board 1 and the semiconductor chip 10 is narrowed to an extent corresponding to the depth of the recesses 4B. This makes it possible to reduce the thickness of the adhesive 16 sandwiched between the wiring board 1 and the semiconductor chip 10. As a result, the expansion of the adhesive 16, in the thickness direction, between the wiring board 1 and the semiconductor chip 10 can be reduced without reducing the height of the bump electrode 15.

The recesses 4B in the electrode pads 4A are formed by elastic deformation of the electrode pads 4A and the soft layer 3. The elastic deformation of the electrode pads 4A and the soft layer 3 occur as a result that the bump electrodes 15 are pressed to the electrode pads 4A by the pressure of the semiconductor chip 10 when this semiconductor chip 10 is mounted over the mounting face of the wiring board 1. As a result, the elastic forces of the electrode pads 4A and the soft layer 3 act upon the bump electrodes 15.

The semiconductor chip 10 of the embodiment is mounted by a process similar to that of the foregoing Embodiment 1.

Here, the soft layer 3 is made of a material having a smaller coefficient of thermal expansion than that of the material of the adhesive 16.

The semiconductor device thus constructed can achieve effects similar to those of the foregoing Embodiment.

Embodiment 3

Figure 14:
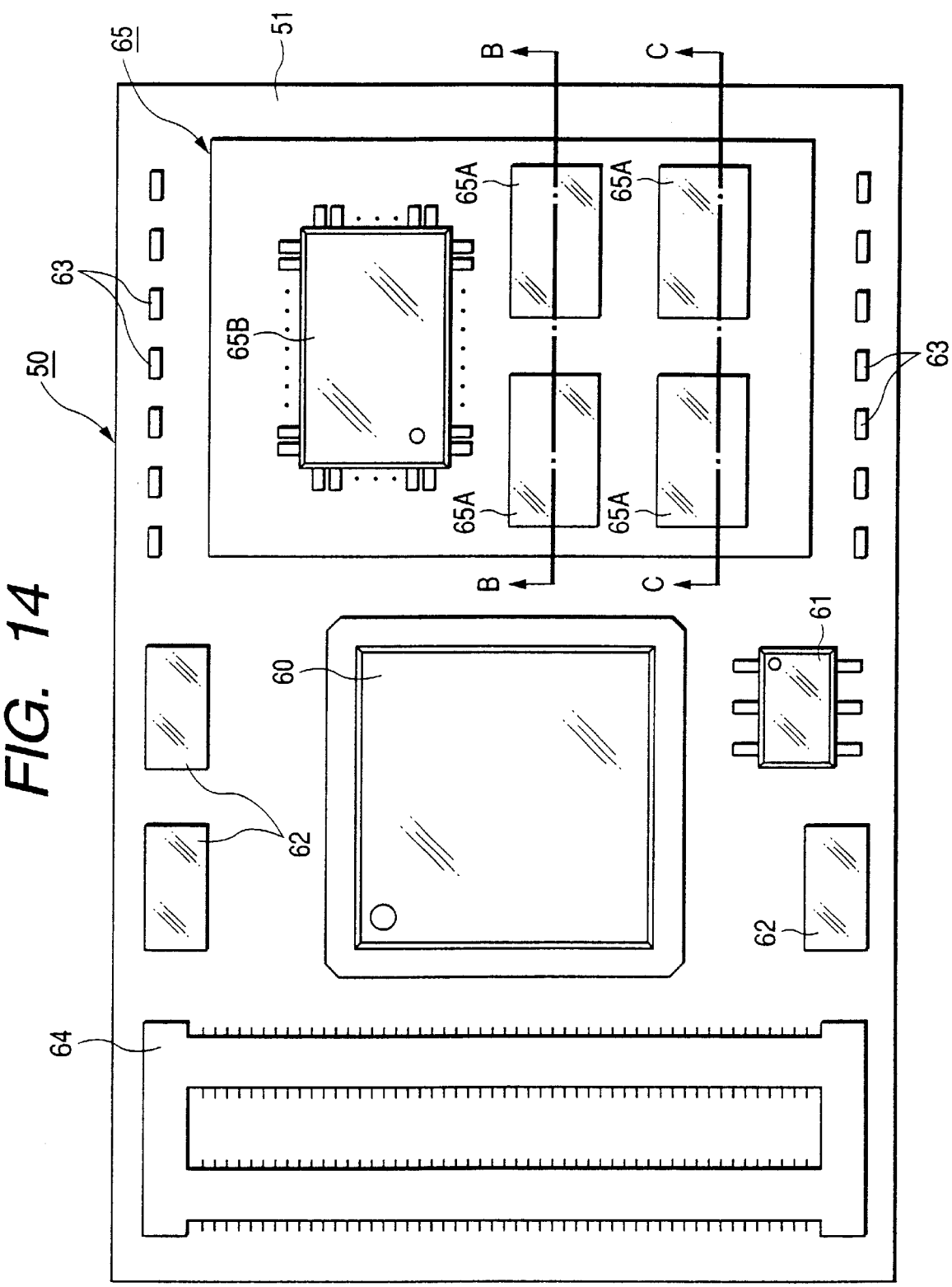
FIG. 14 is a top plan view showing a CPU module (electronic device) of Embodiment 3 of the invention.
Figure 15:
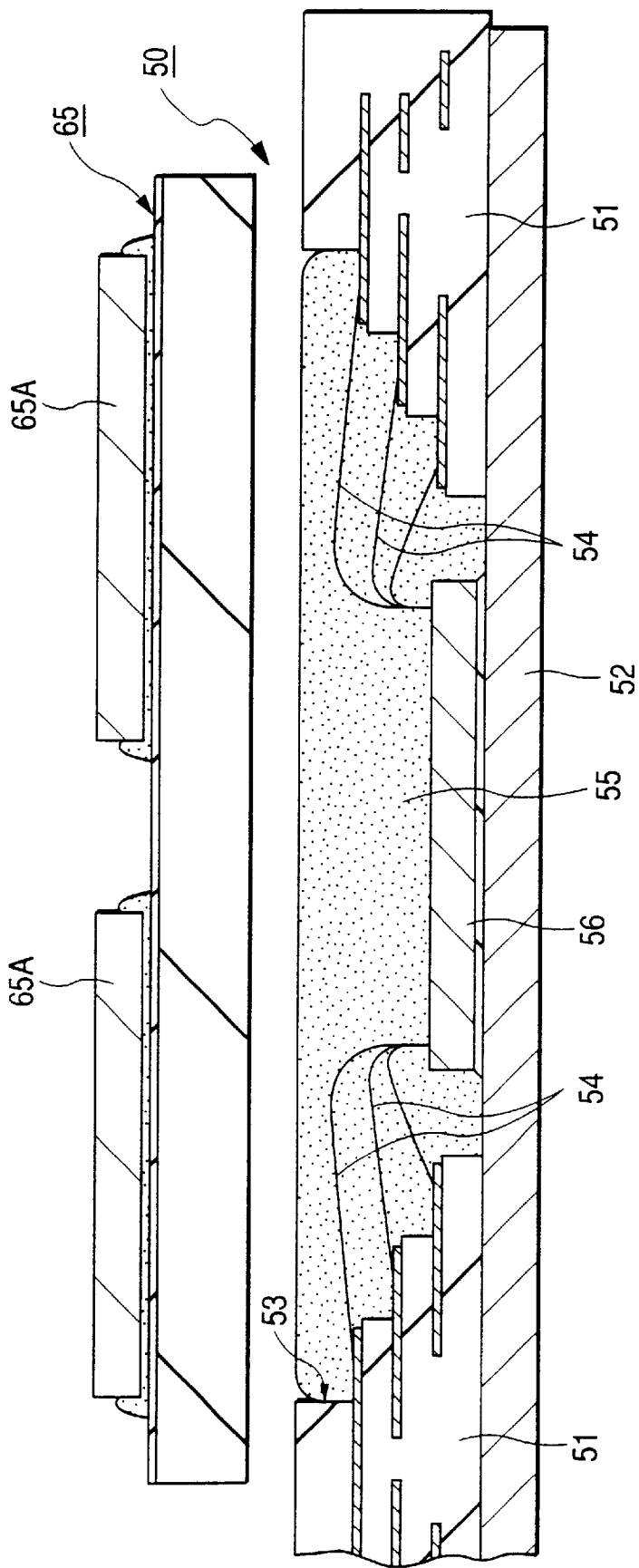
FIG. 15 is a section showing an essential portion of FIG. 14 and taken along line B—B of FIG. 14.
Figure 16:
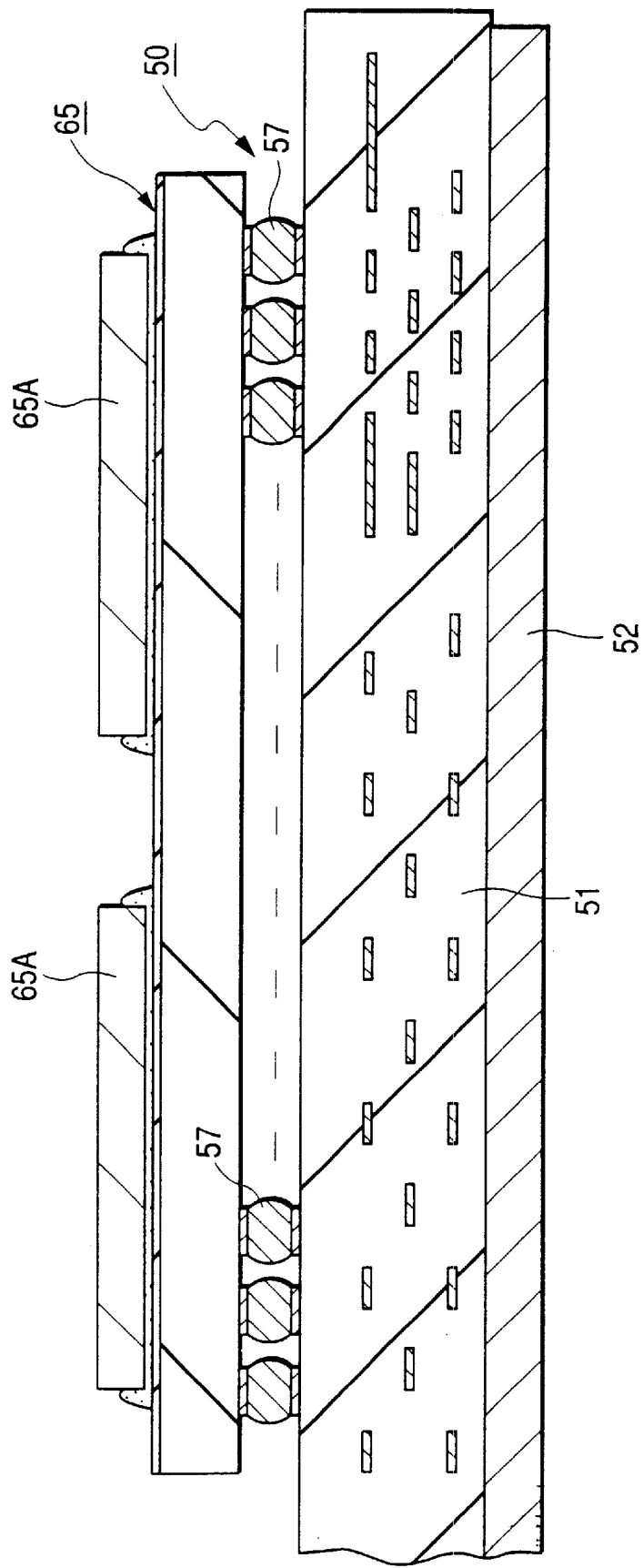
FIG. 16 is a section showing an essential portion of FIG. 14 and taken along line C—C of FIG. 14.

FIG. 14 is a top plan view showing a CPU module (electronic device) of Embodiment 3 of the invention; FIG. 15 is a section showing an essential portion of FIG. 14 and taken along line B—B of FIG. 14; and FIG. 16 is a section showing an essential portion of FIG. 14 and taken along line C—C of FIG. 14.

As shown in FIGS. 14 and 15, a CPU module 50 is constructed so as to have a structure in which a heat diffusion plate made of a metal sheet having a high thermal conductivity is employed as a base and connected directly with a CPU bare chip 56 consuming most of the power of the CPU module 50 and generating a lot of heat and a CPU module board 51. The CPU bare chip 56 and the CPU module board 51 are electrically connected together through gold wires 54, and a cavity 53 where the CPU bare chip 56 is housed is so filled with a potting resin 55 that the shape of the CPU module board 51 may be a rectangular solid. On the CPU module board 51 thus constructed, there are mounted essential parts including a cache sub-module 65, a system controller 60 and an interface connector 64. The cache sub-module 65 and the CPU module board 51 are electrically connected together through bump electrodes 57, as shown in FIG. 16.

Depending upon the applied system, a clock driver 61 is not mounted on the CPU module 50, as shown in FIG. 14, but the clock is supplied from the interface connector 64. Small-sized chip parts 63 include a chip ceramic capacitor mounted as a measure against noise in a relatively high frequency range, a chip resistor used for pull-up of the bus, pull-down for the strapping of the initial setting or damping of the signal, and a chip thermistor used as a temperature sensor. Large-sized chip parts 62 include a chip tantalum capacitor of a large capacitance for absorbing power supply noise in a relatively low frequency range at the transition of the CPU bare chip 56 from the clock stop state to the normal operating state by the supply of clocks, an intelligent temperature sensor for transmitting serially temperature information sensed, a DC/DC converter, a coil and a capacitor of large capacitance, the last three being necessary for generating a special power supply voltage required by the CPU module 50.

On the cache sub-module 65, moreover, there are mounted a necessary number of asynchronous or clock-synchronous cache SRAMs 65A for storing data in accordance with the necessary cache capacity. Two cache SRAMs 65A having a capacity of 1 [Mb] are mounted if a capacity of 256 [Kb] is required, and four cache SRAMs 65A having a capacity of 1 [Mb] are mounted if a capacity of 512 [Kb] is required. The cache sub-module 65 has a space for mounting four cache SRAMs, so that a cache capacity of 1 [Mb] can be ensured if a cache SRAM 65A of 2 [Mb] is employed.

On the cache sub-module 65, there are further mounted a TAG SRAM 65B for storing part of the addresses of the data stored in the cache SRAMs 65A and, if necessary, a decoupling chip ceramic capacitor and a jumper chip resistor for selecting either a cache capacity of 256 [Kb] using two cache SRAMs 65A of 1 [Mb] or a capacity of 512 [Kb] using four cache SRAMs 65A.

The capacity and bit construction which the TAGSRAM is required to have according to the cache capacity varies depending on the cache system, so that their description will be omitted. The cache SRAM 65A and the TAG•SRAM 65B may be both bare chips, or packaged with plastic or ceramic, or one of them may be a bare chip and the other packaged. In the embodiment the cache SRAM 65A is a bare chip whereas the TAG•SRAM 65B is packaged in a QFP by plastic molding.

Figure 17:
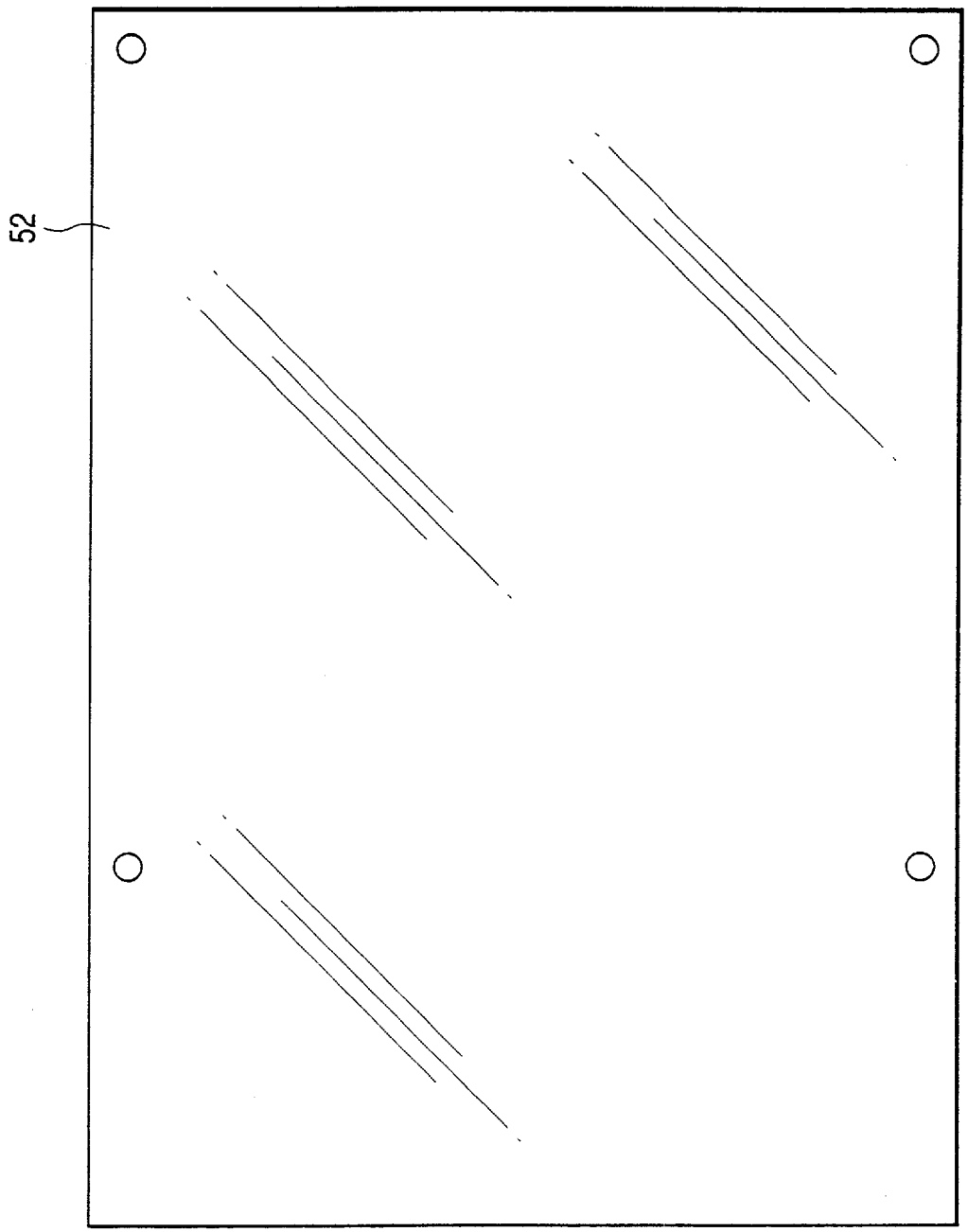
FIG. 17 is a section showing a shape of a heat diffusion plate of the CPU module.

FIG. 17 shows a shape of the heat diffusion plate 52. As shown in FIG. 17, the heat diffusion plate 52 has a plurality of fixing holes but none of electronic parts is mounted or packaged, so that a horizontal flat heat interface is provided. Since the heat interface having a low heat resistance and a simple shape is thus provided, it is easy to design heat dissipation information on the information processing system.

The CPU module 50 thus constructed is assembled in a data processor 70 such as a notebook computer, as shown in FIG. 18. The data processor 70 has a structure including a liquid crystal panel 71 and an adjusting volume 72. By connecting the CPU module 50 with a mother board 73 and by attaching the heat diffusion plate 52 of the CPU module 50 to a lower casing 74, the heat is conducted mainly to the lower casing 74 but hardly to the mother board 73, so that it is not conducted to a keyboard 75. Thus, it is possible to realize a data processor whose keyboard 75 does not become hot, not giving an unpleasant feeling to the user operating the data processor 70. In FIG. 18, reference numeral 76 designates a PC card socket, and numeral 77 designates an HDD/CD-ROM drive. For holding the heat diffusion plate 52 of the CPU module 50 in close contact with the lower casing 74, there are a method of using a thin heat conductive sheet and a method of applying silicone grease.

Although our invention has been specifically described taking the case of the foregoing embodiments, it should not be limited thereto but can naturally be modified in various manners without departing from the gist thereof.

The effects of the representatives of the inventions disclosed herein will be briefly described in the following.

In an electronic device comprising a semiconductor chip which is fixed to the mounting face of a wiring board through adhesive and in which external terminals are electrically connected with electrode pads of the wiring board through bump electrodes, the reliability of connection between the electrode pads of the wiring board and the bump electrodes can be enhanced.

In an electronic device comprising a semiconductor chip which is fixed to the mounting face of the wiring board through adhesive and in which external terminals are electrically connected with the electrode pads of the wiring board through bump electrodes, the reliability of connection between the electrode pads of the wiring board and the bump electrodes can be enhanced.

Since the mounting structure is a flip chip mounting of a bare chip, the mounting height from the board surface to the chip back and the mounting area can be smaller than those of the other wire bonding structures and flat packages (QFP), thereby realizing a high density mounting.

When utilizing the mounting structure, a system (e.g., a data processor) can be thin and small.

In the wiring board employed in the mounting structure, the soft layer on its surface sinks so that the mounting height can be further smaller.

What is claimed is:

1. A method of fabricating an electronic device having a wiring board mounted a first semiconductor device and a second semiconductor device thereon, comprising the steps of:

(a) preparing said wiring board having a main surface and a plurality of electrode pads, said first semiconductor device having a main surface and a plurality of bumps thereon;

(b) positioning said first semiconductor device on said wiring board so as to facing said main surface of said wiring board and said plurality of bumps;

(c) mounting said first semiconductor device to said wiring board by thermocompression bonding using heater;

(d) after step (c), positioning said second semiconductor device on said wiring board so as to arrange said second semiconductor device on said electrode pads through pasty solder; and (e) melting said pasty solder by conducting a heat treatment, mounting said second semiconductor device is completed.

2. A method of fabricating an electronic device according to claim 1, wherein mounting height of said second semiconductor device is higher than that of said first semiconductor device when said first and said second semiconductor devices are mounted.

3. A method of fabricating an electronic device according to claim 1, in the step (c), said bumps are pressed to said electrode pads on said wiring board.

4. A method of fabricating an electronic device according to claim 3, in the step (c), forming recesses in said electrode pads by a pressure when said bumps are pressed.

5. A method of fabricating an electronic device according to claim 1, between in the step (c) and (d), forming a resin between said main surface of said wiring board and said main surface of said first semiconductor device so as to being encapsulated said plurality of bumps therein.

6. A method of fabricating an electronic device according to claim 5, in the step (c), curing said resin by heat using said heater.

7. A method of fabricating an electronic device according to claim 1, in the step (c), adhering between said main surface of said wiring board and said main surface of said first semiconductor device by an adhesive.

8. A method of fabricating an electronic device according to claim 1, wherein said first semiconductor device comprising:

a semiconductor chip having main surface, a plurality of elements and a plurality of external terminals formed on said main surface;

said plurality of bumps electrically connected with said external terminals, respectively.

9. A method of fabricating an electronic device according to claim 1, wherein said bumps are made of gold.

* * * * *